United States Patent
Hergenrother et al.

(10) Patent No.: US 6,197,641 B1
(45) Date of Patent: Mar. 6, 2001

(54) PROCESS FOR FABRICATING VERTICAL TRANSISTORS

(75) Inventors: John Michael Hergenrother, Short Hills; Donald Paul Monroe, Berkeley Heights; Gary Robert Weber, Whitehouse Station, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/335,707

(22) Filed: Jun. 18, 1999

Related U.S. Application Data

(63) Continuation of application No. 09/143,274, filed on Aug. 28, 1998, now Pat. No. 6,027,975.

(51) Int. Cl.$^7$ .................................................. H01L 21/336
(52) U.S. Cl. ............................................ 438/268; 438/138
(58) Field of Search ........................................ 438/268, 270, 438/269, 212, 135, 138, 156, 197

(56) References Cited

U.S. PATENT DOCUMENTS

| | | | |
|---|---|---|---|
| 4,670,768 | * 6/1987 | Sunami et al. | |
| 5,324,673 | 6/1994 | Fitch et al. | 437/40 |
| 5,612,563 | 3/1997 | Fitch et al. | 257/329 |
| 5,969,384 | * 10/1999 | Hong | 257/322 |
| 6,015,725 | * 1/2000 | Hirayama | 438/156 |
| 6,020,257 | 2/2000 | Leedy | 438/626 |

FOREIGN PATENT DOCUMENTS

| | | | |
|---|---|---|---|
| 0504946A1 | 9/1992 | (EP) | H01L/29/784 |

* cited by examiner

*Primary Examiner*—Tuan H. Nguyen
(74) *Attorney, Agent, or Firm*—Richard J. Botos

(57) ABSTRACT

A process for fabricating a vertical MOSFET device for use in integrated circuits is disclosed. In the process, at least three layers of material are formed sequentially on a semiconductor substrate. The three layers are arranged such that the second layer is interposed between the first and third layers. The second layer is sacrificial, that is, the layer is completely removed during subsequent processing. The thickness of the second layer defines the physical gate length of the vertical MOSFET. In the process the first and third layers have etch rates that are significantly lower than the etch rate of the second layer in an etchant selected to remove the second layer. The top layer, which is either the third or subsequent layer, is a stop layer for a subsequently performed mechanical polishing step that is used to remove materials formed over the at least three layers. After the at least three layers of material are formed on the substrate, a window or trench is formed in the layers. The window terminates at the surface of the silicon substrate in which one of either a source or drain region is formed in the silicon substrate. The window or trench is then filled with a semiconductor material. This semiconductor plug becomes the vertical channel of the transistor. Therefore the crystalline semiconductor plug is doped to form a source extension, a drain extension, and a channel region in the plug. Subsequent processing forms the other of a source or drain on top of the vertical channel and removes the sacrificial second material layer. The removal of the sacrificial second layer exposes a portion of the doped semiconductor plug. The device gate dielectric is then formed on the exposed portion of the doped semiconductor plug. The gate electrode is then deposited. The physical gate length of the resulting device corresponds to the deposited thickness of the second material layer.

23 Claims, 7 Drawing Sheets

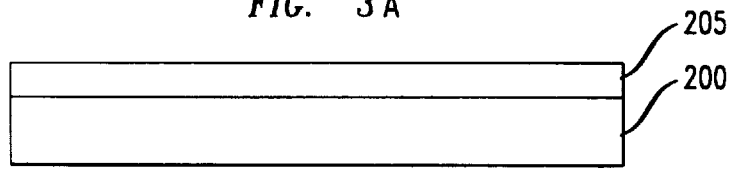
*FIG. 3*A
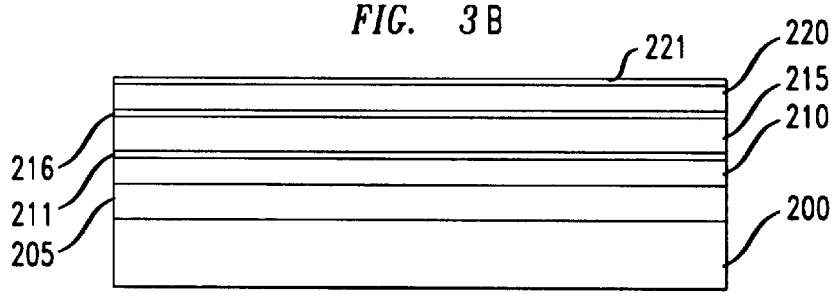
*FIG. 3*B
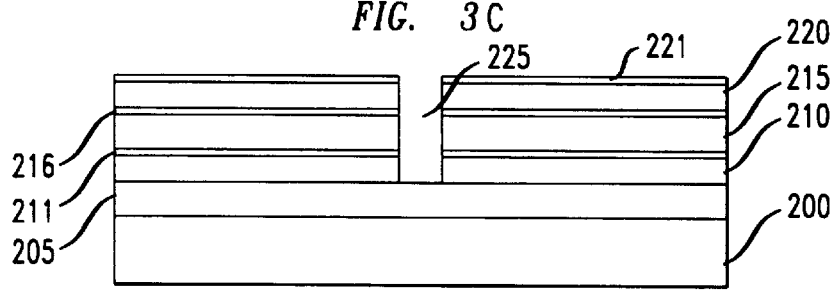
*FIG. 3*C
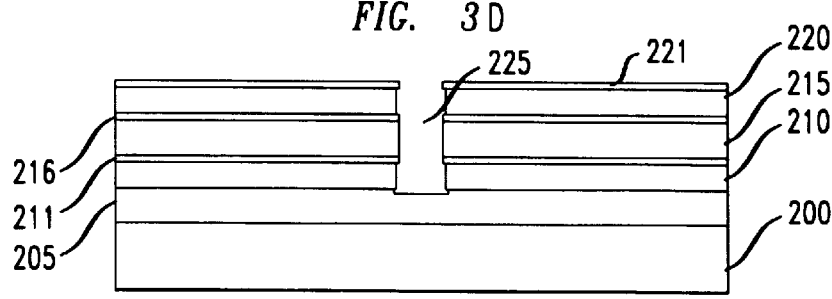
*FIG. 3*D
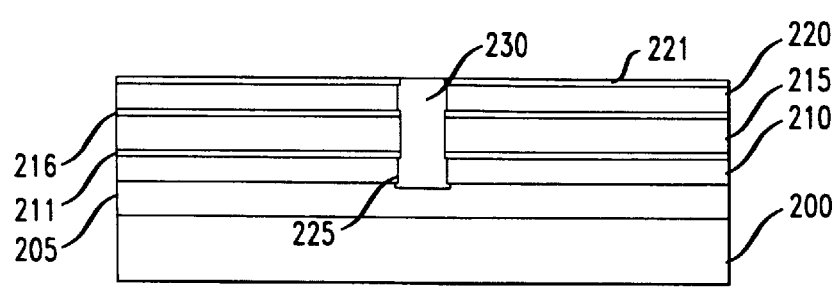
*FIG. 3*E

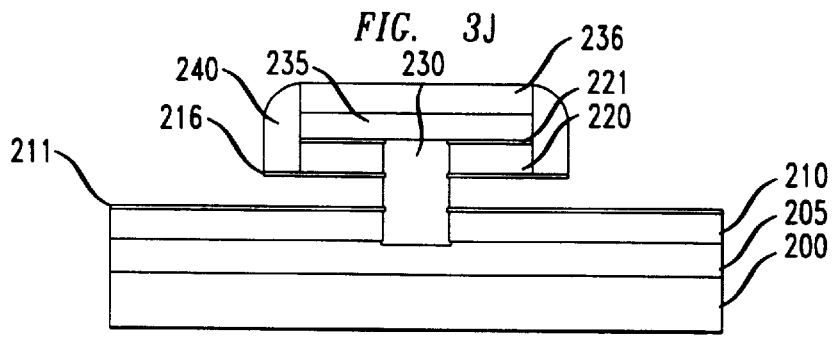
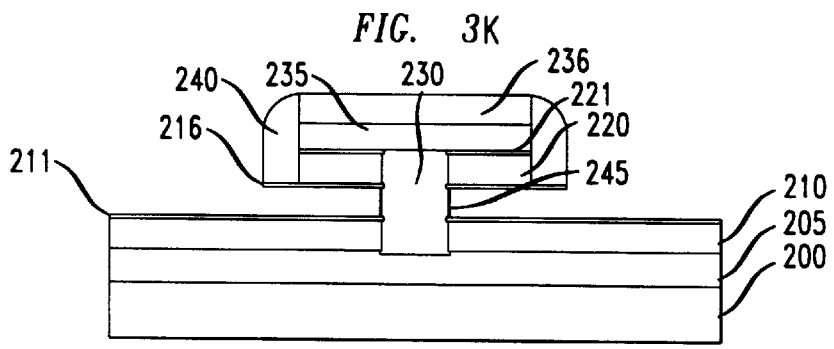
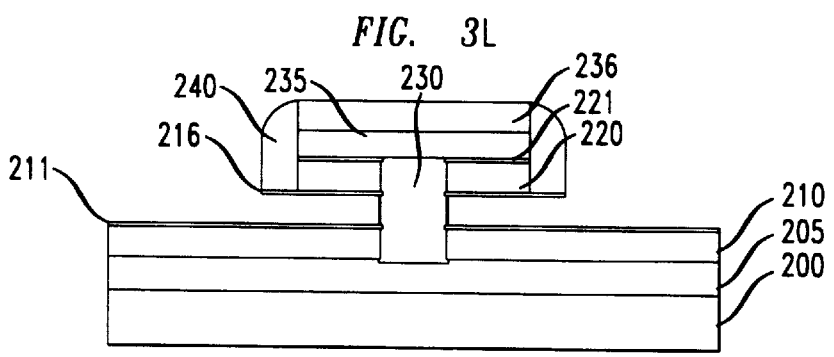
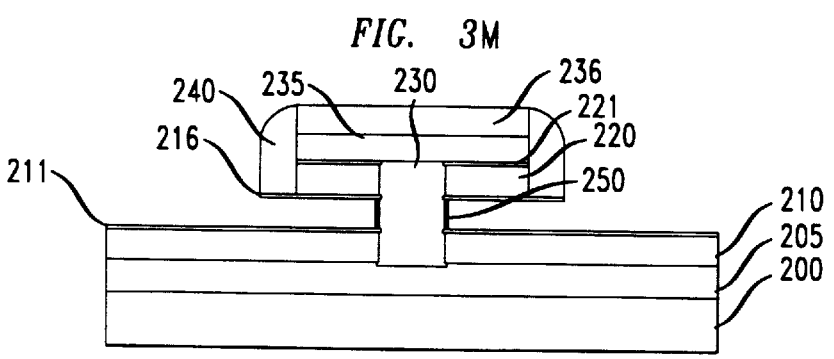

PROCESS FOR FABRICATING VERTICAL TRANSISTORS

This is a continuation of application Ser. No. 09/143,274, filed on Aug. 28, 1998, now U.S. Pat. No. 6,027,975.

BACKGROUND OF THE INVENTION

1. Technical Field

The present invention is directed to a process for fabricating vertical transistors.

2. Art Background

In integrated circuits, there is a trend toward a higher device density to increase the number of devices per unit area. Device density is increased by making individual devices smaller and placing the devices closer together. Device dimensions (termed feature size or design rules) are decreasing from 0.25 µm to 0.18 µm and beyond. It is also desired to decrease the distance between devices in a commensurate fashion.

Currently, most MOS (metal oxide semiconductor) transistors have a planar configuration. In a planar MOS device, the direction of the current flow is parallel to the plane of the substrate surface. Although there is a need to decrease the size of these devices to achieve increased device density, fabricating these small devices becomes increasingly difficult. In particular, lithography becomes extremely difficult as device dimensions decrease to less than the wavelength of the radiation used to delineate an image of a pattern in a radiation-sensitive material.

A vertical device configuration, described in Takato, H., et al., "Impact of Surrounding Gate Transistor (SGT) for Ultra-High-Density LSI's" *IEEE Transactions on Electron Devices*, Vol. 38 (3), pp. 573–577 (1991) has been proposed as an alternative to the more space-consuming planar device configuration. A schematic of the device is illustrated in FIG. 1. The device 10 has a source 15, drain 20, and channel 25. The length of the channel 25 is perpendicular to the surface of the substrate 30 on which the device 10 is formed. The device is called a vertical transistor because the length of the channel is perpendicular to the substrate surface. A gate 35 surrounds the channel 25.

Although vertical MOSFETs (metal oxide semiconductor field effect transistors) can be packed more densely than planar MOSFETs, the processing issues for the vertical transistors are not trivial. A process that makes it easier and more efficient to fabricate vertical MOSFETs is therefore desired.

SUMMARY OF THE INVENTION

The present invention is directed to a process for fabricating a vertical MOSFET. In the process, a multilayer stack of material is formed on a semiconductor substrate. Examples of suitable semiconductor substrates include silicon substrates and silicon on insulator (SOI) substrates. The surface region of the silicon substrate has been heavily doped (i.e., a dopant concentration in excess of $1 \times 10^{19}$ atoms/cm$^3$ of dopant). The multilayer stack of material has at least three layers. The first layer is an electrically insulating material, e.g. silicon nitride. The first layer of insulating material has a thickness in the range of about 25 nm to about 250 nm. The thickness of the first layer is selected so that the capacitance between the gate and the source or drain (depending upon which of the source or the drain is formed in the substrate) is sufficiently low. This consideration favors a thickness within the higher portion of the above-described range. The thickness of the first layer is also selected so that the series resistance of the source/drain extension is sufficiently low and that outdiffusion from the heavily doped region of the substrate to form the source/drain extension is readily accomplished. These considerations favor a thickness within the lower portion of the above-described range. One skilled in the art will be able to select a suitable thickness based upon the above-described considerations, as well as other considerations that apply to specific embodiments.

A second layer of material is formed over the first layer of material. However, the material of the second layer (e.g., silicon dioxide ($SiO_2$)) has a significantly different etch resistance to a selected etchant than the insulating material of the first layer. Specifically, for the selected etchant, the etch rate of the material of the second layer is much higher than the etch rate of the insulating material of the first layer. It is advantageous if the etch rate of the second layer of material in the selected etchant is at least about ten times faster than the etch rate of the first layer of material. For the selected etchant, the etch rate of the material of the second layer is also at least ten times faster than the etch rate of a semiconductor material in which the channel of the device is formed. Crystalline silicon is one example of such a semiconductor material. It is advantageous if the etch rate of the material of the second layer is at least 100 times faster than the etch rate of the semiconductor material.

The thickness of the second layer of material is selected to define the physical gate length of the device. This is because this second layer is sacrificial, i.e., it will be removed and the gate of the device will be formed in the space defined by this layer. Defining the gate length in this manner provides much better gate length control than is achievable using conventional lithographic techniques and subsequent pattern transfer using dry etch techniques.

A third layer of material is formed over the second layer. The material selected for the third layer is an electrically insulating material. It is advantageous if the insulating material in the third layer has a lower etch rate in the selected etchant than the material of the second layer. It is advantageous if the ratio of the etch rate, in the selected etchant, of the material in the second layer to the etch rate of the material in the third material layer is at least ten to one. From the standpoint of ease of processing, it is advantageous if the material of the first layer is the same as the material of the third layer.

The top layer in the at least three-layer stack is a stop layer that protects the underlying structure from subsequent processing (e.g. chemical mechanical polishing). If the third layer is not a suitable stop for subsequent chemical mechanical polishing, a fourth layer (e.g. silicon nitride) is then formed over the structure. The fourth layer also acts as a dopant diffusion barrier. Specifically, the layer prevents dopant diffusion from material underlying the fourth layer into material overlying the fourth layer or into the ambient during subsequent processing.

A window or trench (referred to simply as a window hereinafter) is then etched through the three-layer structure (for simplicity, this description will simply refer to the three layer structure) to the heavily-doped surface of the silicon substrate. The dimensions of the window are determined by the size constraints for the particular device and the limitations of the lithographic techniques used to form the window. The window is formed using conventional lithographic techniques. Specifically, a mask is formed over the three-layer structure by forming a layer of an energy-definable material thereon and introducing an image of a pattern into the layer of energy-definable material therein. The pattern is then developed and the only portion of the three-layer structure exposed through the mask is the portion that corresponds to the dimensions and placement of the desired window or trench. The window is then etched into the three-layer structure. After the window is etched, the portions of the mask remaining on the substrate surface are removed using conventional expedients well known to one skilled in the art.

The window is then filled with a semiconductor material. Although the semiconductor material is either crystalline, polycrystalline, or amorphous, typically the semiconductor material is a crystalline material such as silicon, silicon-germanium, or silicon-germanium-carbon. The crystalline semiconductor material need not be uniform in composition. The crystalline semiconductor material is either doped or undoped. Techniques for forming crystalline semiconductor materials in windows are well known to one skilled in the art. For example, in one technique, the crystalline material is formed in the window or trench by selective epitaxial growth. In another embodiment, an amorphous layer of the semiconductor material is deposited on the substrate and all but the semiconductor material deposited in the window is removed. The amorphous semiconductor material is then annealed to recrystallize the material (solid phase epitaxy).

The channel of the device and the source and drain extensions of the device are formed in the semiconductor (e.g. silicon) plug formed in the window. Therefore, the silicon plug is doped in certain regions. The concentration and distribution of the n-type and p-type dopants in the plug are controlled in order to obtain the desired device performance. Consequently, the concentration and distribution of dopants are largely a matter of design choice. A variety of ways to dope the silicon plug are contemplated as suitable to obtain the desired concentration and distribution of dopants.

In one embodiment, a doped silicon plug is formed either in-situ during growth, by implantation after the plug is formed, or by another suitable expedient. Dopants can also be driven into the plug from one or more of the adjacent multiple layers of material (i.e. the multiple layers of material in which the crystalline semiconductor-filled window is formed) to form the source and drain extensions and/or to produce a lateral doping profile in the device channel. This technique is known as solid phase diffusion. In solid phase diffusion a doped oxide (e.g. silicon dioxide) is used as a dopant source. The silicon dioxide is doped with the desired dopant (e.g. arsenic, phosphorus, and boron). At elevated temperatures, the dopant is driven from the doped oxide into the adjacent crystalline semiconductor material. This technique is advantageous because the doped area is defined by the interface between the plug and the layer of material used as the dopant source. This technique allows for the formation of self-aligned device regions in the silicon plug. As used herein, device regions include source/drain extensions (i.e. source and drain extension regions that are aligned to the gate) and the device channel. One skilled in the art will appreciate that any combination of the above-described doping techniques can be used to obtain the desired distribution and concentration of dopants in the silicon plug.

One skilled in the art is familiar with the manner in which dopants are introduced in situ as a layer of material is formed via chemical vapor deposition, and such techniques are not described in detail herein. Generally, the dopants are introduced into the atmosphere at the appropriate point in the deposition of the material so that the dopants are present in the desired place in the silicon plug and at the desired concentration. In other embodiments, dopants are implanted in the channel after the channel is formed or diffused out from the heavily doped substrate into the bottom of the plug.

After the doped silicon (or other semiconductor) plug is formed, another layer of material is formed over the substrate. The layer of material has an etch resistance in the selected etch expedient that is comparable to the etch resistance of the first and third material layers. It is advantageous, based on process considerations, for this layer of material to be the same as the third material layer.

Another etch mask is formed over the substrate using conventional lithographic techniques. This etch mask is patterned so that the portion of the material layer overlying the silicon plug and the portion of this layer that is adjacent to the plug are not exposed through the mask. The resulting masked structure is then anisotropically etched to the second material layer. As a result of the etch, the portion of the second layer underlying the unmasked part of the structure is exposed. The resulting structure is then isotropically etched. As a result of the etch and the difference in etch rate between the second material layer and the first and third material layers, the second material layer is completely removed but the first material layer and the portion of the third, fourth and fifth material layers over and adjacent to the top of the silicon plug remain. As a result of this etch, the portion of the silicon plug that corresponds to the thickness of the second layer is exposed. The exposed portion of the silicon plug defines the gate length of the device being formed.

The substrate is then optionally subjected to conditions that grow a layer of thermal oxide on the exposed portion of the silicon plug. The layer of thermal oxide is then removed using conventional expedients (e.g., aqueous hydrofluoric acid or anhydrous hydrofluoric acid). This optional sacrificial oxidation is done to repair sidewall defects and/or damage.

Depending upon the thickness of the sacrificial oxide, the sacrificial oxidation can also be used to reduce the device susceptibility to short-channel effects. This is relevant in the embodiment in which one or more of the material layers are used as dopant sources to form the source and drain extensions of the device. The sacrificial oxide, once removed leaves a recess in the silicon plug. For a given sheet resistance in the source and drain extensions, short channel effects are reduced by recessing the surface of the channel region in the silicon plug with respect to the surface of the source and drain extension regions in the silicon plug. In this way, the source and drain extensions can be made deeper than the junction depth as viewed from the channel of the device. Specifically, after the sacrificial oxide is removed, a gate oxide is formed on a recessed region of the plug that results from the formation and removal of the sacrificial oxide. For certain orientations of the starting substrate (e.g. [100]-Si), when the gate oxide is formed by a thermal oxidation process, the oxide grows thicker on the sides of the recess (the portions adjacent to the source/drain extensions) than the bottom of the recess (the portion adjacent to the channel). This results in lower gate/source and gate/drain overlap capacitances.

For plugs in certain configurations (e.g. cylindrical), the formation of the thermal oxide on the semiconductor plug is a self-limiting process. A self-limiting process for silicon oxide formation is described in Liu, H. I., et al., "Self-Limiting Oxidation for Fabricating Sub-5 nm Silicon Nanowires," *Apl. Phys. Lett.*, Vol. 64, No. 11, pp. 1383–1385 (1994), which is hereby incorporated by reference. The process is self-limiting because after sufficiently long oxidation in a certain temperature range (e.g. 700° C. to 1100° C.), the thickness of the oxide will not increase. Consequently, in certain embodiments, there is no need to monitor sacrificial oxide formation. Once the desired thickness of sacrificial oxide is ascertained, it can be determined if this is a self-limiting thickness under certain conditions. If it is, then the sacrificial oxide is formed under those conditions. The duration of the oxide formation is selected to ensure that the oxide formation proceeds to its self-limiting thickness. In this embodiment, there is no need to monitor oxide thickness to determine when the desired thickness is obtained. The desired thickness is obtained after a certain time. This technique of self-limited sacrificial oxidation can also be used to leave behind a very thin (e.g. less than about 50 nm thick), but uniform semiconductor plug. This controlled reduction of the thickness of the semiconductor plug can significantly improve the short-channel performance of the device.

As previously noted, after the layer of thermal oxide is removed, a layer of gate dielectric (e.g. silicon dioxide or other suitable high dielectric constant materials) is formed on the exposed portion of the silicon plug. Examples of other suitable gate dielectric materials include silicon nitride, silicon oxynitride and metal oxides (e.g. tantalum pentoxide, titanium oxide, and aluminum oxide). The thickness of the gate dielectric ranges from about 1 nm to about 20 nm. The selected thickness will depend upon the dielectric constant of the dielectric material.

In one embodiment, a gate dielectric layer of silicon dioxide is formed by heating the substrate to a temperature in the range of about 700° C. to about 1100° C. in an oxygen-containing atmosphere. Both furnace oxidation and rapid thermal oxidation are contemplated as suitable. Other expedients, such as chemical vapor deposition, jet vapor deposition, or atomic layer deposition are also contemplated as suitable for forming the gate dielectric. Conditions for forming a gate dielectric of the desired thickness are well known to one skilled in the art.

A gate electrode is then formed by depositing a sufficiently conformal layer of a suitable gate material (e.g. in situ doped amorphous silicon) on the substrate. The layer is patterned and subsequently recrystallized to form the gate. The gate configuration is largely a matter of design choice. However, the gate does surround the portion of the silicon plug with the gate oxide formed thereon.

DETAILED DESCRIPTION

The present invention is directed to a process for fabricating a vertical transistor. In the process, multiple layers of material are formed on the surface of a silicon substrate in which either a source region or a drain region for the device is formed. The multiple layers have different etch resistances in a selected etch expedient. One of the layers in the multiple layer structure is a sacrificial layer used to define the physical gate length of the device. Specifically, the thickness and placement of the sacrificial layer defines the thickness and placement of the gate of the vertical transistor.

Figure 1:
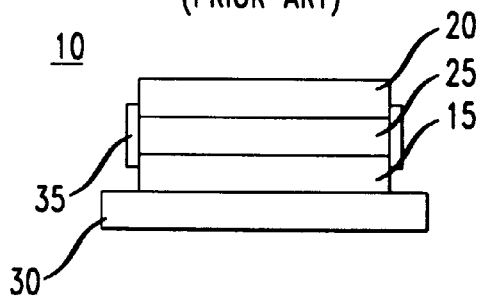
FIG. 1 is a schematic side view of a vertical transistor.
Figure 2A:
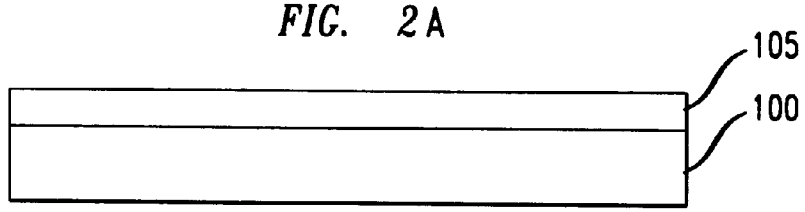
FIGS. 2A–2J illustrates the process sequence of one embodiment of the present invention.

One embodiment of the present invention is described with reference to FIG. 2A–2J. Referring to FIG. 2A, a heavily doped source region 105 is formed in silicon substrate 100. In this embodiment, the source region of the device is formed in the silicon substrate and the drain region is formed on top of the subsequently formed vertical channel. In an alternate embodiment, the drain region is formed in the substrate and the source region is formed on top of the subsequently formed vertical channel. The embodiment wherein the source region is formed in the substrate is the subject of this description. From this description, one skilled in the art could easily form a device in which the drain region is formed in the silicon substrate and the source region is formed on top of the subsequently formed vertical channel.

The depth of the heavily doped source region, the concentration of dopant therein and the type of dopant (i.e. n-type or p-type) are all a matter of design choice. A heavily doped source region 105 wherein the dopant is phosphorus (P), arsenic (As), antimony (Sb) or boron (B), the peak dopant concentration is in the range of about $1\times10^{19}$ atoms/$cm^3$ to about $5\times10^{20}$ atoms/$cm^3$, and the depth of the region in the substrate is less than about 500 nm, is contemplated as suitable.

Figure 2B:
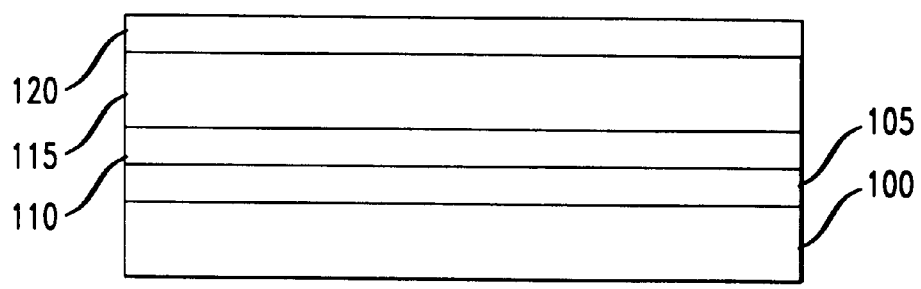

Referring to FIG. 2B, three layers of material 110, 115, and 120, are formed over the heavily doped source region 105 in the silicon substrate 100. The first layer of material 110 is an electrically insulating material such as silicon nitride. Material layer 110 electrically isolates the deep source region 105 from the overlying gate electrode (155 in FIG. 2J). Thus, material layer 110 is made of a material and has a thickness that is consistent with this objective. A thickness in the range of about 10 nm to about 250 nm is contemplated as suitable for material layer 110.

A second layer of material 115 is formed over the first layer of material 110. However, the material of the second layer 115 has a significantly different etch resistance to a selected etchant than the insulating material of the first layer 110. Specifically, for the selected etchant, the etch rate of the material of the second layer 115 is much higher than the etch rate of the insulating material of the first layer 110. It is advantageous if, for the selected etchant, the etch rate of the material of the second layer 115 is much higher than the etch rate of a semiconductor material in which the device channel is formed (i.e. the plug material (130 in FIG. 2D)). Crystalline silicon is an example of a suitable semiconductor plug material.

The thickness of the second layer 115 of material is selected to define the physical gate length of the device. This is because this second layer 115 is sacrificial, i.e., it will be removed and the gate of the device will be formed in the space defined by this layer. When the sacrificial second layer 115 is removed, the gate oxide (150 in FIG. 2H) is formed on what is to become the channel of the device.

A third layer of material 120 is formed over the second layer 115. The material selected for the third layer 120 is an electrically insulating material. It is advantageous if the insulating material in the third layer 120 has a lower etch rate in the selected etchant than the material of the second layer 115. It is advantageous if the ratio of the etch rate, in the selected etchant, of the material in the second layer 115 to the etch rate of the material in the third material layer 120 is at least about ten to one.

Figure 2C:
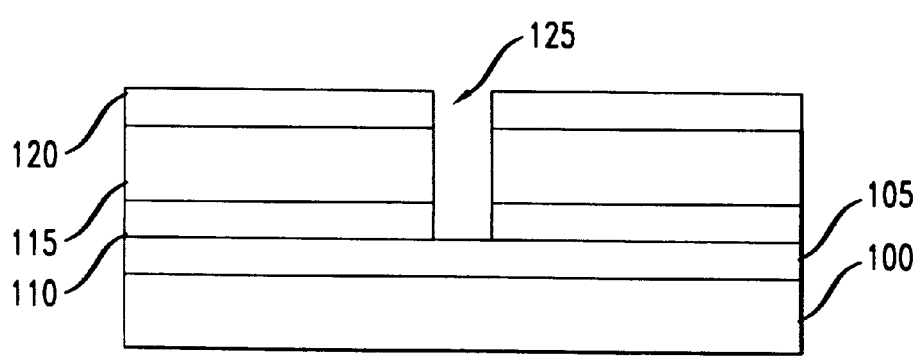

Referring to FIG. 2C, an opening such as a window or trench 125 (for convenience, window or trench will simply be referred to as a window hereinafter) is then etched through the three layers 110, 115, and 120 to the heavily-doped surface 105 of the silicon substrate 100. The cross-sectional thickness (horizontal dimension in cross-section) of the window is determined by the size constraints for the particular device and the limitations of the lithographic techniques used to form the window. The length of the trench (the length being orthogonal to both the horizontal dimension in cross-section as well as the vertical direction) is largely a matter of design choice. For a given horizontal dimension in cross-section, the current passed through the conductor formed in the opening will increase with increasing trench length. The window is formed using conventional lithographic techniques.

Figure 2D:
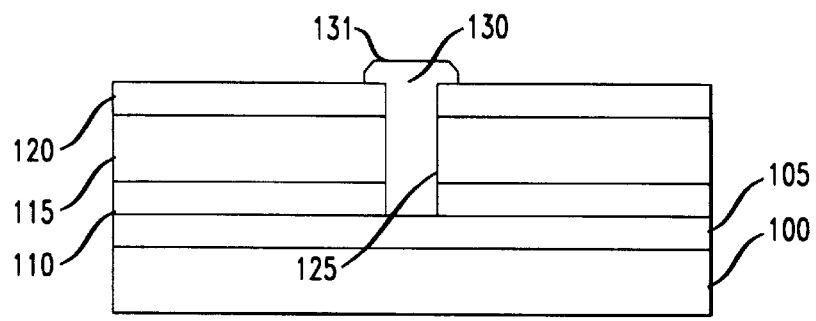

Referring to FIG. 2D, the window 125 is then filled with a single crystal semiconductor material such as silicon 130. Other examples of crystalline semiconductor materials include silicon-germanium and silicon-germanium-carbon. The crystalline semiconductor material is either doped or undoped. Techniques for forming crystalline semiconductor materials in windows are well known to one skilled in the art. For example, the crystalline material is formed in the window 125 by selective epitaxial growth. In another embodiment, an amorphous layer of the semiconductor material is deposited on the surface of the substrate and all but the semiconductor material 130 deposited in the window 125, and a small plug 131 at the top of the window 125, is removed. The amorphous semiconductor material is then annealed to recrystallize the material.

The semiconductor (e.g. silicon) plug formed in the window 125 becomes the channel of the device. Therefore, the silicon plug 130 is doped to form the channel (not shown) as well as source and drain extensions (also not shown). Dopants of one type (i.e. n-type or p-type) are introduced into the silicon plug 130 to form the source and drain extensions and dopants of the opposite type are introduced into the plug to form the channel. A variety of ways to dope the silicon plug are contemplated as suitable. In-situ doping of the silicon plug as it is formed or implantation of dopants into the silicon plug after it is formed are contemplated as suitable expedients.

Dopants can be driven into the single crystalline silicon plug 130 by using layers 110 and 120 as sources of the dopant for the source and drain extensions. This technique is known as solid phase diffusion in which an oxide (e.g. silicon dioxide) is used as a dopant source. The silicon dioxide is doped with the desired dopant (e.g. arsenic, phosphorus, and boron). At elevated temperatures, the dopant is driven from the doped oxide to the adjacent undoped (or doped with the opposite type dopant) crystalline semiconductor material. This technique is advantageous because the doped area is defined by the interface between the silicon plug 130 and the layer(s) of material, 110 and 120, used as the dopant source. This technique allows for the formation of self-aligned source/drain extensions (i.e. the source/drain extensions are aligned with the gate). Examples of solid phase diffusion techniques are described in Ono, M., et al., "Sub-50 nm Gate Length N-MOSFETS with 10 nm Phosphorus Source and Drain Junctions," *IEDM*93, pp. 119–122 (1993) and Saito, M., et al., "An SPDD D-MOSFET Structure Suitable for 0.1 and Sub 0.1 Micron Channel Length and Its Electrical Characteristics," *IEDM*92, pp. 897–900 (1992), which are hereby incorporated by reference.

One skilled in the art is familiar with the manner in which dopants are introduced in situ as a layer of material is formed via chemical vapor deposition and such techniques are not described in detail herein. Generally, the dopants are introduced into the atmosphere at the appropriate point in the deposition of the material so that the dopants are present in the desired place in the silicon plug and at the desired concentration. In other embodiments, dopants are implanted in the channel after the channel is formed and diffused out from the heavily doped substrate into the bottom of the plug to form a source/drain extension region. Ion implantation is a suitable expedient for forming the source/drain extension regions at the top and at the bottom of the plug.

Figure 2E:
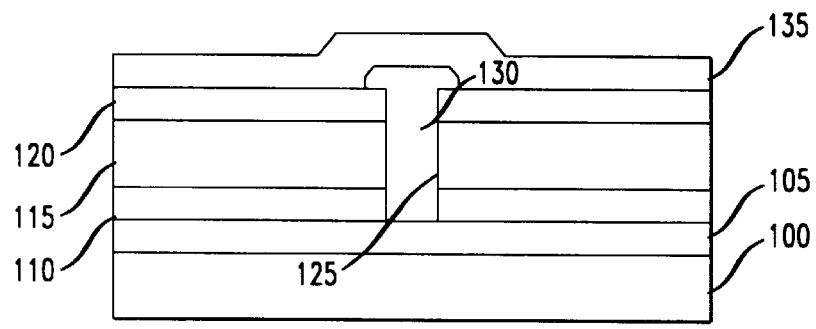

After the window 125 is filled with single crystal silicon 130, a fourth layer of insulating material 135 is formed over the substrate as illustrated in FIG. 2E. The layer 135 is a material that has an etch resistance in the selected etch expedient that is comparable to the etch resistance of layers 110 and 120. It is convenient, based on process considerations, for layer 135 to be of the same material as layer 120 underneath it. Once the silicon plug 130 is doped and the dopant is distributed in the plug 130 in the desired manner, the substrate is not subjected to conditions that significantly affect the distribution of the dopant in the silicon plug 130. Consequently, after this step, the substrate is not exposed to temperatures that exceed 1100° C. It is advantageous if the substrate is not exposed to temperatures in excess of 1000° C. after this point in the process. In certain embodiments, the substrate is not exposed to temperatures that exceed 900° C. after this point in the process for prolonged periods of time (e.g. in excess of several minutes). However, the substrate can be subjected to a rapid thermal anneal at temperatures of up to about 1050° C. without adversely affecting the distribution of the dopant in the silicon plug 130.

Figure 2F:
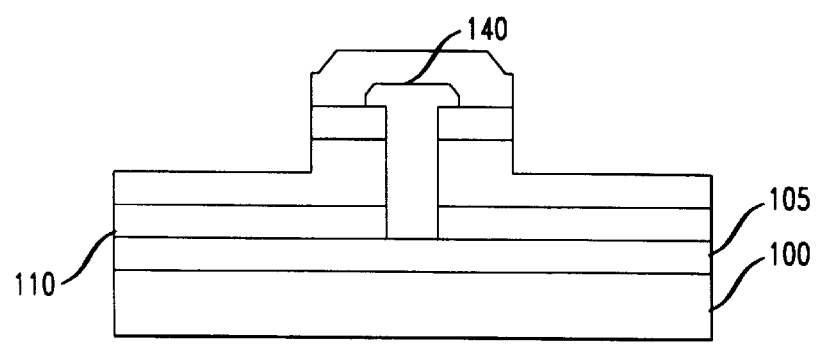

Another etch mask (not shown) is formed over the multilayer structure using conventional lithographic techniques. This etch mask is patterned so that the portion of the fourth material layer overlying the silicon filled window and the portion of the fourth material layer adjacent to the windows are not exposed through the mask. The structure with the etch mask formed thereon is then etched anisotropically using a conventional dry etch expedient. In the dry etch expedient, the etch rates of layers 115, 120, and 135 are about the same, or layer 115 has a lower etch rate than that of layers 120, and 135. The structure obtained as a result of this etch is illustrated in FIG. 2F. As a result of this etch, the portion of layers 135 and 120 that are exposed throughout the mask are completely removed. Also, the portion of layer 115 that is not covered by the mask is etched part way through its thickness.

Figure 2G:
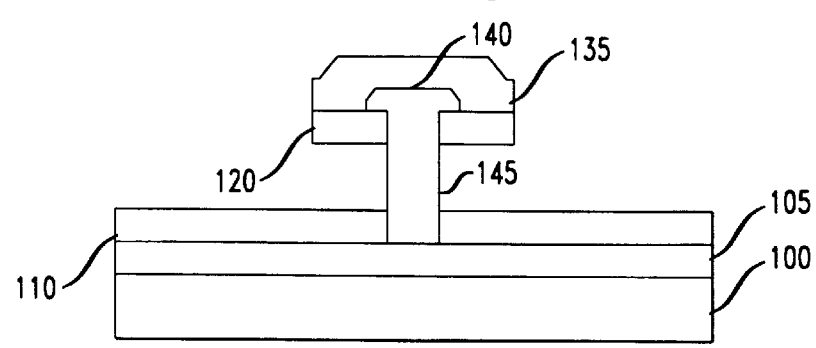
Figure 2H:
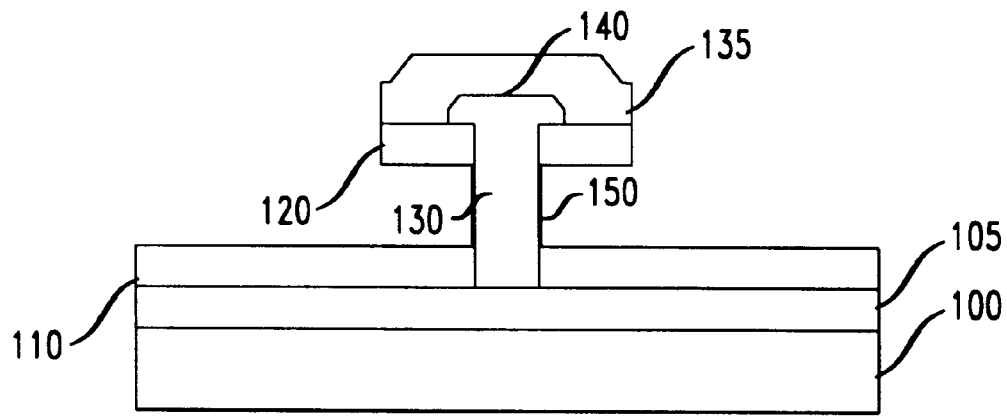

The substrate is then subjected to a wet etch or isotropic dry etch expedient. The etch rate of layer 115 in this expedient is significantly faster than the etch rate of layers 110, 120, and 135. As illustrated in FIG. 2G, due to the etch selectivity in the wet etch expedient, the sacrificial layer between layers 110 and 120 is completely removed without removing a significant portion of layer 110 and the remaining portions of layers 120 and 135. The portion of layers 120 and 135 over and adjacent to the top 140 of the silicon plug 130 remain. As a result of this etch the portion of the silicon plug 130 that corresponds to the thickness of layer 115 is exposed. The exposed surface 145 of the plug 130 will be the physical gate length of the device being formed.

The substrate is then optionally heated in an oxygen-containing atmosphere to grow a layer of thermal oxide (not shown) on the exposed surface of the crystal silicon plug 130. The thin layer of thermal oxide is removed using conventional expedients such a wet etch (e.g., aqueous hydrofluoric acid). As a result of the formation and removal of the sacrificial thermal oxide, the surface of the silicon plug 130 is smoother and some of the sidewall defects are removed. The particular conditions used to form and remove the sacrificial oxide are optionally selected to tailor the width of the silicon plug to a desired dimension.

After the thin layer of thermal oxide is removed, a layer of gate dielectric (e.g. silicon dioxide, silicon oxynitride, silicon nitride or metal oxide) 150 (FIG. 2H) is formed on the exposed portion of the silicon plug 130. The thickness of the gate dielectric is about 1 nm to about 20 nm. In one embodiment, the silicon dioxide layer is formed by heating the substrate to a temperature in the range of about 700° C. to about 1100° C. in an oxygen-containing atmosphere. Other expedients for forming the gate dielectric, such as chemical vapor deposition, jet vapor deposition, and atomic layer deposition, are also contemplated as suitable. Conditions for forming a gate dielectric of the desired thickness are well known to one skilled in the art.

Figure 2I:
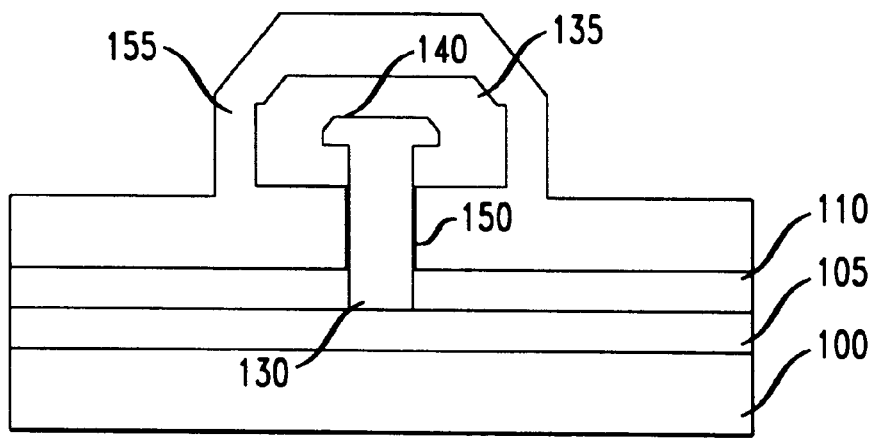
Figure 2J:
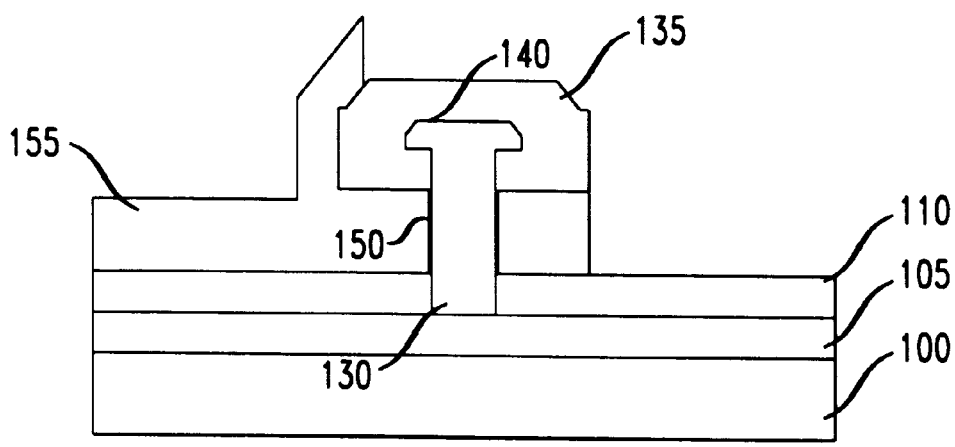

Referring to FIG. 2I, a gate electrode is then formed by depositing a conformal layer 155 of suitable gate material (e.g. in situ doped amorphous silicon). The amorphous silicon is then subsequently recrystallized using conditions that do not significantly affect the dopant profiles of the dopants in the silicon plug. Other examples of suitable gate materials include polycrystalline silicon, silicon-germanium, and silicon-germanium carbon. Metals and metal compounds that have a suitably low resistivity, a work function that is sufficiently near the band gap of the semiconductor plug material and are compatible with the gate dielectric material and semiconductor processing are also contemplated as suitable gate materials. Examples of such metals include titanium, titanium nitride, tungsten, tungsten silicide, tantalum, tantalum nitride, molybdenum, aluminum and copper. Suitable expedients for forming the layer of gate material include chemical vapor deposition, electroplating, and combinations thereof Referring to FIG. 2J, the layer 155 is patterned to form the gate 155. The gate configuration is largely a matter of design choice. However, the gate does surround the portion of the silicon plug with the gate oxide formed thereon.

Another embodiment of the present invention is described with reference to FIGS. 3A–3P. Referring to FIG. 3A, a heavily-doped source region 205 is formed in silicon substrate 200. One example of a suitable substrate 200 is a silicon substrate doped with boron. The concentration of boron dopant is about $2 \times 10^{15}$ atoms/cm$^3$. The depth of the deep source region, the concentration of dopant therein and the type of dopant (i.e. n-type or p-type) are all a matter of design choice. An n$^+$ deep source region 205 wherein the dopant is antimony or arsenic, the peak dopant concentration is greater than $1 \times 10^{19}$ atoms/cm$^3$, and the depth of the doped region in the substrate is less than about 500 nm, is contemplated as suitable. In one example, arsenic is implanted at a dose of about $1 \times 10^{15}$ atoms/cm$^2$ using an implant energy of 200 keV.

Referring to FIG. 3B, six layers of material 210, 211, 215, 216, 220 and 221, are formed over the deep source region 205 in the silicon substrate 200. The first layer of material 210 is an electrically insulating material. Material layer 210 electrically isolates the deep source region 205 from what will eventually be the overlying gate electrode (265 in FIG. 3P). Thus, material layer 210 is made of a material and has a thickness that is consistent with this objective. Examples of suitable materials include doped silicon oxides. In certain embodiments, the first layer is also used as a source for dopants. The dopant source is used for doping the subsequently formed vertical channel (FIG. 3C) of the device.

One example of a silicon oxide doping source is PSG (phosphosilicate glass, i.e., a phosphorus-doped silicon oxide). One skilled in the art is aware of the suitable expedients for forming a layer of PSG on a substrate (e.g. plasma-enhanced chemical vapor deposition (CVD)). Suitable thicknesses are in the range of about 25 nm to about 250 nm. In one example, the PSG layer had a 200 nm thickness.

A second layer of material 211 is formed over the first layer of material 210. The second layer is intended as an etch stop. An etch stop, as one skilled in the art is aware, is designed to prevent an etch from proceeding to an underlying layer or layers. One skilled in the art is aware that the selection of an etch stop layer is determined by the particular etch expedients used to etch the overlying layers. In the process of the present invention wherein the overlying layers are PSG and undoped silicon oxide (e.g. silicon oxide formed from tetraethylene ortho silicate (TEOS)), an etch stop material that effectively stops etchants for such materials from penetrating to underlying layers is selected. Silicon nitride is contemplated as a suitable etch stop material. The thickness of an etch stop layer is largely dependent upon the resistance of the etch stop material to the selected etchant (i.e. to be an effective etch stop, the etchant cannot penetrate the etch stop layer in the time needed to conduct the etch). In one example, the etch stop layer was 25 nm thick.

Layer 211 also functions as an offset spacer. The thickness of the offset spacer is determined by the thickness of deposited layer 211. In the context of the present invention, an offset spacer controls the position of the junction between the source and drain extensions and the channel relative to the gate of the device. Specifically, the presence of the offset spacer prevents the source/drain extensions from extending as far under the gate as they otherwise would extend if the offset spacer were not present. One skilled in the art is aware that, the further that the source/drain extension extends under the gate, the greater the adverse consequences on device performance (i.e., gate/source and gate/drain overlap capacitances are increased). One skilled in the art will appreciate that the offset spacers cannot be so thick as to provide a series resistance between the source/drain extensions and the inversion layer under the gate that would provide unacceptable device performance. Layer 211 performs this function by its presence between layer 210 and layer 215 and when adjacent layer 210 is a source for dopants. For a given vertical distance moved by the dopants from the dopant source 210, the amount of overlap between the source/drain extension and the gate can be controlled precisely through the thickness of layer 211 together with dopant diffusion.

A third layer of material 215 is formed over the second layer of material 211. However, the insulating material of the third layer 215 has a significantly different etch resistance to a selected etchant than the insulating material of the etch stop layer 211. Specifically, for the selected etchant, the etch rate of the insulating material of the third layer 215 is much higher than the etch rate of the insulating material of the etch stop layer 211.

The thickness of the third layer of material 215 is selected to correspond to the gate length of the device. When the sacrificial third layer 215 is removed, the gate oxide (250 in FIG. 3M) is formed on what is to become the channel 260 (FIG. 3P) of the device. In three exemplary embodiments, the thickness of layer 215 and, consequently, the device gate lengths were 50 nm, 100 nm and 200 nm, respectively.

In one embodiment of the present invention, the third layer of material 215 is also a doped silicon oxide such as a doped silicate glass. Typically, the type of dopant (i.e. n-type or p-type) is opposite the type used to form the device source and drain regions. For example, if the source and drain regions are n-type (i.e. doped with arsenic or phosphorus) then the dopant in layer 215 is p-type (e.g. boron). One example of a suitable doped oxide is borosilicate glass (BSG). However, in certain embodiments it may be desired to use layer 215 as a source for introducing compensating dopant into a channel that is already uniformly doped with the opposite type (referred to as a retrograde dopant profile). Also, a dopant concentration gradient can be introduced into layer 215 to effect a desired dopant concentration gradient (i.e. vertical doping profile) in the device channel. One skilled in the art is capable of providing a dopant source layer with the desired dopant type and concentration to achieve the desired effect.

A fourth layer of material 216 is formed over the third layer 215. This fourth layer of material 216 has a similar function as layer 211. Therefore the considerations that govern the selection of a material and thickness of layer 211, govern the selection of a material and thickness for layer 216. In one example, layer 216 was 25 nm thick. Fourth layer 216 also functions as an offset spacer. However, the thickness of layer 216 is not required to be the same as the thickness of layer 211. Therefore, the thickness of the offset spacer can be independently chosen for layers 211 and 216 to achieve the desired balance between overlap capacitance (which favors a thicker offset spacer) and low series resistance (which favors a thinner offset spacer).

A fifth layer of insulating material 220 is formed over the fourth layer 216. It is convenient if the insulating material in the fifth layer 220 has the same etch rate in the selected etchant as the insulating material of the first layer 210. Also, the fifth layer can optionally be a source for dopant. From the standpoint of ease of processing, it is advantageous if the material of the first layer 210 is the same as the material of the fifth layer 220. In one example, layer 220 was 100 nm thick.

A chemical mechanical polishing (CMP) stop layer 221 is formed over layer 220. CMP stop layer 221 protects layer 220 during subsequent processing, when materials overlying layer 221 are removed by chemical mechanical polishing. Materials that have suitable resistance to removal by chemical mechanical polishing are well known to one skilled in the art. One example of a suitable material is silicon nitride. A silicon nitride layer having a thickness of about 25 nm to about 50 nm is a suitable stop layer for chemical mechanical polishing. Layer 221 also functions as a barrier to dopant outdiffusion from the top of the underlying layer 220.

Referring to FIG. 3C, a window 225 is then etched through the six layers 210, 211, 215, 216, 220 and 221 to the heavily-doped region 205 of the silicon substrate 200. The diameter of the window is determined by the size constraints for the particular device and the limitations of the lithographic techniques used to form the window. The window is formed using conventional lithographic techniques. The window 225 is then subjected to a chemical clean (e.g. RCA or piranha-clean) to clean the silicon at the bottom of the window. As a result of this cleaning step, a small portion of the layers 210 and 220 adjacent to window 225 are removed. The results of this etch are illustrated in FIG. 3D.

Referring to FIG. 3E, the window 225 is then filled with a crystalline semiconductor material (e.g. silicon) 230. Techniques for forming single crystalline silicon in windows are well known to one skilled in the art. In one embodiment, epitaxial silicon is deposited selectively in the window 225.

In another embodiment, amorphous silicon is deposited over the entire substrate surface and all but the silicon 230 deposited in the window 225 is removed by chemical mechanical polishing. The amorphous semiconductor material is then recrystallized by annealing the substrate. The resulting structure is depicted in FIG. 3E. As previously noted, layer 221 acts as a stop to the chemical mechanical polishing.

Figure 3F:
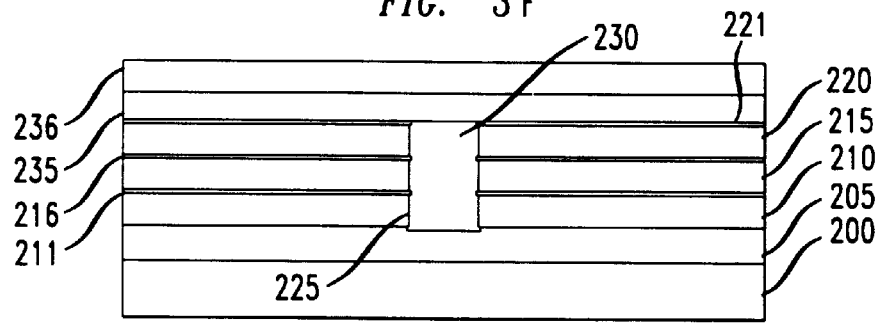
FIGS. 3A–3P illustrates the process sequence of a second embodiment of the present invention.
Figure 3G:
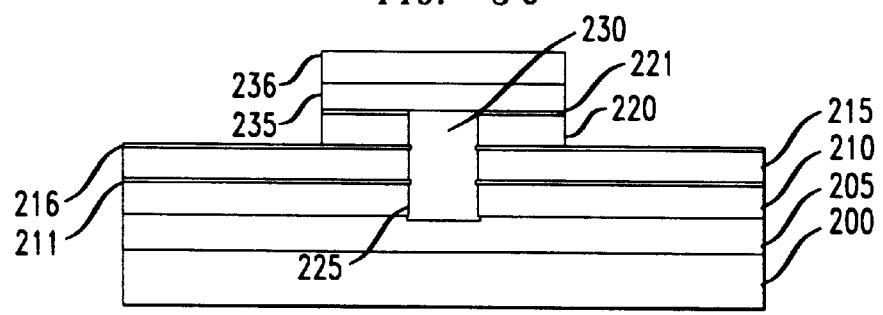
Figure 3H:
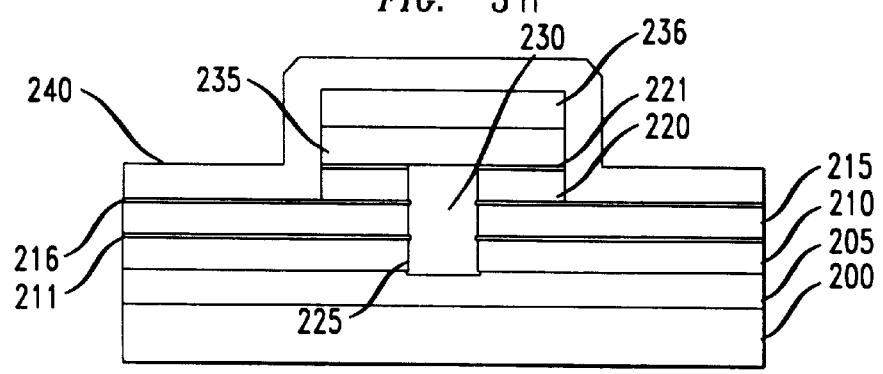
Figure 3I:
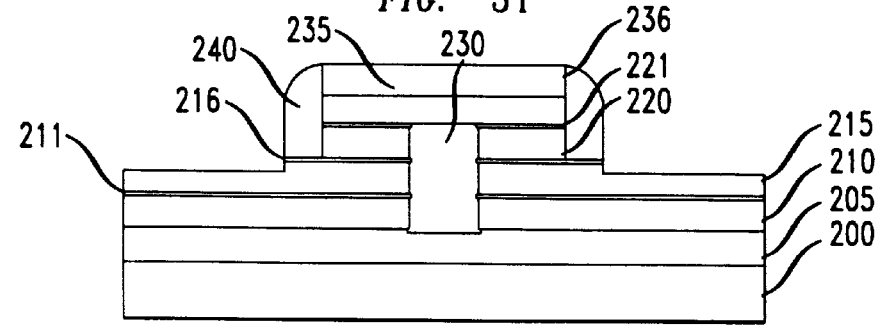
Figure 3N:
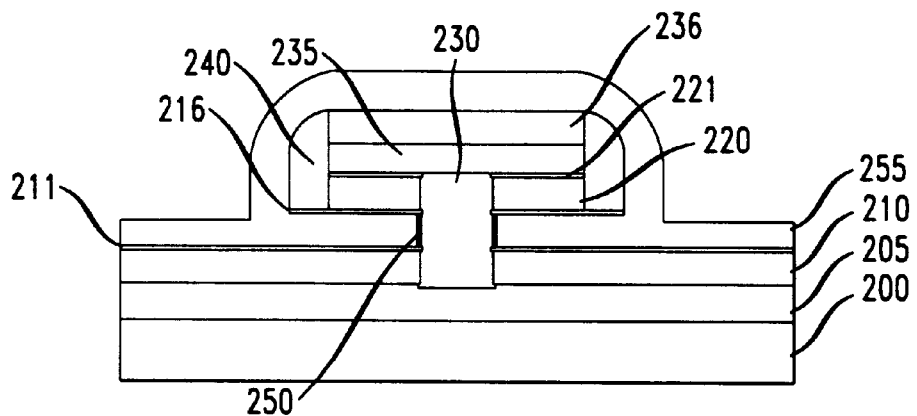
Figure 3O:
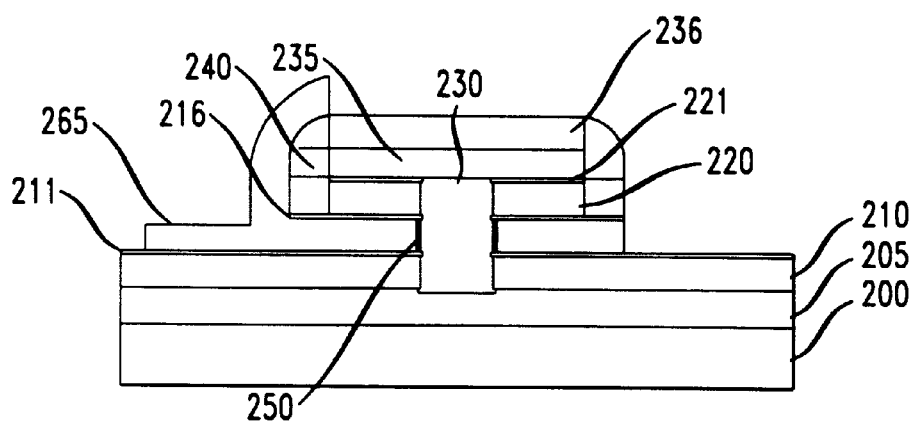
Figure 3P:
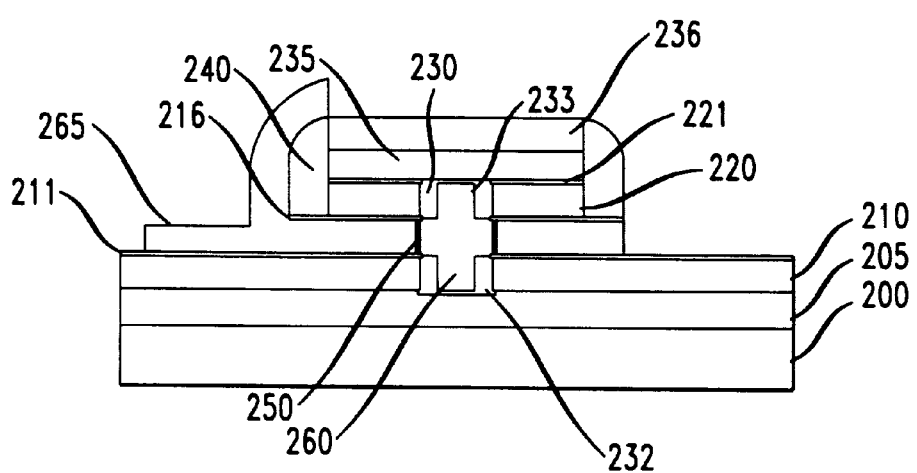

The crystalline semiconductor plug 230 formed in the window 225 becomes the channel of the device (260 in FIG. 3P). Therefore, the crystalline semiconductor plug 230 is doped. It is advantageous if the dopant for channel region 260 is introduced in situ as the plug 230 is being formed. However, implantation of the dopant is also contemplated as suitable.

As previously noted, layers 210 and 220 can be a self-aligned dopant source for the source and drain extensions. Similarly, layer 215 can be a self-aligned dopant source for the channel. The concentration gradient of the dopant in the dopant source layers can be controlled in order to introduce a corresponding vertical dopant gradient in the respective source/drain extension region or channel region of the plug 230.

After the window 225 is filled with crystalline semiconductor 230, and the semiconductor 230 is doped in the desired manner, a sixth layer of material 235 is formed over the substrate as illustrated in FIG. 3F. The layer 235 is a material that provides for a self-aligned top contact (drain contact 235 in FIG. 3G). One example of a suitable material is doped polycrystalline silicon. The selected dopant is a type of dopant that is opposite the type used to dope the silicon channel (260 in FIG. 3P). The concentration of the dopant is greater than about $10^{20}$ atoms/cm$^3$. In one embodiment, layer 235 was 100 nm thick.

As illustrated in FIG. 3F, a layer of material 236 is deposited over layer 235. This material is patterned so that the remaining portion overlies the crystalline semiconductor plug 230, and the region adjacent thereto (FIG. 3G). The material for layer 236 is selected to have an etch rate that is significantly lower than the etch rate of the material of layer 215 in the etchant selected to remove layer 215. In this regard it is advantageous if the material selected from layer 236 is the same as the material of layers 211 and 216. One example of a suitable material is silicon nitride. The layer of silicon nitride 236 is formed over the layer 235 using the previously described techniques.

As illustrated in FIG. 3G, using conventional lithographic techniques, layers 236, 235, 221 and 220 are patterned (using one or more dry etch steps) so that only those portions of the layers either overlying the silicon filled window, and/or adjacent to the silicon filled window, remain. The remaining portions of layers 220, 221, 235, and 236 form the drain of the device. As illustrated in FIG. 3H, a layer of material 240 is then deposited. The material for layer 240 is selected to have an etch rate that is significantly lower than the etch rate of the material of layer 215 in the etchant selected to remove layer 215. One example of a suitable material for layer 240 is silicon nitride. The thickness of layer 240 is selected so that the remaining portions of layers 236, 235, 221 and 220 are protected from contact with subsequent etchants. In one embodiment, layer 240 was 150 nm thick. Layer 240 is then etched using an anisotropic etchant such as a dry plasma etch. As illustrated in FIG. 3I, the only portion of layer 240 that remains after the anisotropic etch is the portion adjacent to layers 220, 221, 235 and 236. As a result of this etch, layer 215 is exposed.

The substrate is then subjected to a wet etch (e.g. aqueous buffered hydrofluoric acid) or an isotropic dry etch (e.g. anhydrous hydrofluoric acid), which removes the exposed, remaining portion of layer 215. As illustrated in FIG. 3J, the remaining portion of layer 210 is still covered by layer 211 and layers 220, 221 and 235 are encapsulated by the remaining portions of layers 216, 236, and 240. Consequently, the remaining portions of layers 210, 220, 221 and 235 remain isolated from contact with subsequent etch expedients.

Optionally, a sacrificial layer of oxide is grown on the exposed surface of silicon plug 230 as a surface preparation technique. Referring to FIG. 3K, a layer of sacrificial thermal silicon dioxide 245 is grown on the exposed surface of silicon plug 230. In one example, the thickness of this sacrificial oxide layer was 6 nm. Sacrificial silicon oxide thicknesses on the order of less than about 10 nm are contemplated as suitable. The sacrificial silicon oxide 245 is then removed (FIG. 3L) using a conventional isotropic etch (e.g. aqueous hydrofluoric acid). As a result of the formation and removal of the sacrificial oxide, the surface of the silicon plug 230 is smoother and some of the sidewall defects and etch damage are removed. Layer 211 prevents the wet etch expedient from contacting layer 210. As a result of this etch the portion of the silicon plug 230 that corresponds to the deposited thickness of layer 215 is exposed. The exposed portion of the plug 230 defines the physical gate length of the device being formed.

The sacrificial layer 245 also reduces the amount to which the subsequently formed gate oxide thins near the layer 211 and 216. When the sacrificial oxide 245 is formed, some of the silicon near layers 211 and 216 is oxidized. These portions of the silicon that have been oxidized are removed. Because some of the silicon near the layers 211 and 216 is removed, there is less stress on the subsequently formed gate oxide near layers 211 and 216, which define the edges of the subsequently formed gate.

In alternate embodiments, the sacrificial oxide is also used to provide increased resistance to short channel effects while maintaining a suitable low sheet resistance in the source/drain extensions. Short channel effects such as drain-induced barrier lowering, threshold voltage rolloff and degradation of the sub-threshold swing generally cause an increase in the device off-current. Such increases in device off-current are not desired. Increased resistance to short channel effects is accomplished by forming a thicker sacrificial oxide. Since the sacrificial oxide is removed, the thicker the sacrificial oxide, the more recessed the surface of the channel region of the device will be in the silicon plug 230, relative to the surface of the source 232 and drain 233 extensions formed in the silicon plug. Consequently, the depth of the source 232 and 233 extensions from the perspective of the channel surface in the silicon plug is shallower than the depth of the source and drain extensions from the perspective of the surface of the source and drain extensions. One skilled in the art is well aware that reducing the depth of the source 232 and drain 233 extensions from the perspective of the channel surface makes the device more resistant to short channel effects. By using the sacrificial oxide to recess the channel surface with respect to the source and drain extensions, a transistor device with elevated source and drain extensions is formed.

The particular thickness of the sacrificial oxide will depend upon the depth of the source and drain extensions for a particular device. For example, if the depth of the source and drain extensions of a device is 30 nm, then one might grow a sacrificial oxide with a thickness of 50 nm. When the sacrificial oxide is removed, the channel of such a device will be recessed about 22 nm below the surface of the source and drain extensions. In this example, the depth of the source/drain extensions with respect to the channel surface is about 8 nm.

A description of how to scale the depth of the source/drain extensions as viewed from the channel and therefore how to select a sacrificial oxide thickness in order to obtain a desired device effect is described in Brews, J. R., et al., "Generalized Guide for MOSFET Miniaturization," *IEDM*, p. 215 (1979), which is incorporated by reference herein. One skilled in the art is able to select conditions in order to obtain a desired thickness of the sacrificial oxide.

In the process of the present invention, there is an upper limit to the thickness of the sacrificial oxide that can form on the silicon plugs in certain configurations. This upper limit depends upon the oxidation conditions. Once that thickness is reached, the oxide will get no thicker under these conditions. This process is advantageous because it is self-limiting. Consequently, one need not monitor the thickness of the oxide to determine endpoint. One can form very thin (less than 50 nm) uniform plugs in this way.

In the embodiments of the present invention where a thick (i.e. greater than 10 nm thick) sacrificial oxide is formed, the thickness of the nitride layers 211 and 216 are selected to ensure that they act as etch stops to protect layer 210 and 220 during the removal of this thick sacrificial oxide. Layers 211 and 216 must also be thick enough to mechanically withstand the stresses introduced when the thick sacrificial oxide is formed. Nitride layers having a thickness that is at least about one-third the sacrificial oxide thickness are contemplated as suitable. Nitride layers that are at least about one-half the thickness of the sacrificial oxide layer can withstand mechanical stress better than thinner layers.

The substrate is then subjected to conditions that form a layer of gate dielectric 250 on the exposed portion of the silicon plug 230. The resulting structure is illustrated in FIG. 3M. The thickness of the gate dielectric 250 is about 1 nm to about 20 nm. One example of a suitable thickness is 2.8 nm. For example, if the semiconductor plug is silicon, a gate dielectric layer of silicon dioxide is formed by heating the substrate to temperature in the range of about 700° C. to about 1100° C. in an oxygen-containing atmosphere. Other expedients for forming gate dielectrics (e.g. chemical vapor deposition, jet vapor deposition, or atomic layer deposition) are also contemplated as suitable. Conditions for forming a gate dielectric of the desired thickness are well known to one skilled in the art.

Referring to FIG. 3N, a gate electrode is then formed by depositing a layer 255 of sufficiently conformal and suitable gate material (e.g. a layer of doped amorphous silicon in which the dopant is introduced in situ). The amorphous silicon is then subsequently recrystallized to form polycrystalline silicon. The dopant concentration is sufficient so that the resistivity of layer 255 is sufficiently low. Referring to FIG. 3O, the layer 255 is patterned to form the gate of the device 265. The gate configuration is largely a matter of design choice. However, the gate does surround the portion of the silicon plug 230 with the gate oxide 250 formed thereon. The deposited thickness of this gate layer is required to be at least one-half the thickness of sacrificial layer 215 (e.g. 150 nm in the example where the thickness of layer 215 was either 50 nm, 100 nm or 200 nm).

Referring to FIG. 3P, dopants are then driven into the crystalline semiconductor plug 230 by solid phase diffusion from dopant source layers 210 and 220 to form source 232 and drain 233 extensions. Layer 221 prevents the dopants in layer 220 from diffusing out of layer 220. The advantage of this technique is that the source and drain extensions (and, consequently, the channel of the device) are aligned with what will become the gate of the device. The concentration of the dopant in the portion of the crystalline semiconductor plug 230 that is doped by solid phase diffusion for source layers 210 and 220 is typically at least about $1\times10^{19}/cm^3$, with dopant concentrations of about $5\times10^{19}/cm^3$ to about $1\times10^{20}/cm^3$ contemplated as advantageous. With this solid phase diffusion technique, very shallow source and drain extensions are obtainable. The distance that the source 232 and drain 233 extensions penetrate into the plug 230 is preferably less than one half of the width of the plug. Limiting dopant penetration in this manner avoids significant overlap in doped regions from opposite sides of the plug 230. Also, the distance that the source 232 and drain 233 extensions extend under the device gate is preferably limited to less than one-fourth of the gate length. The dopants are of the opposite type of the dopant that is in the channel region 260 of the plug 230.

In another alternate embodiment, a thin layer (e.g. a thickness of about 25 nm) of undoped silicon dioxide is formed over layer 205. Referring to FIG. 3E, this layer (not shown) acts as a barrier to solid phase phosphorous dopant diffusion from the heavily-doped dopant-source layer 210, down through layer 205, and up in to the silicon plug 230 as it is formed.

The embodiments described above are provided to illustrate specific examples of processes that utilize the present invention. One skilled in the art will appreciate that there are many process sequences, materials, and expedients that are useful for practicing the present invention. The present invention is not to be construed as limited to the illustrative embodiments, except as is consistent with the appended claims.

What is claimed is:

1. A process for fabricating a vertical transistor comprising:
    forming a first device region selected from the group consisting of a source region and a drain region of a semiconductor device in a semiconductor substrate;
    forming a multilayer stack comprising at least three layers of material over the first device region in the semiconductor substrate wherein the second layer is interposed between the first and the third layers;
    forming a window in the at least three layers of material, wherein the window terminates at the first device region formed in the semiconductor substrate;
    filling the window with a semiconductor material thereby forming a semiconductor plug in the at least three layers of material, wherein the plug has a first end and a second end and wherein the first end is in contact with the first device region;
    chemical mechanical polishing the surface of the substrate after the window is filled with the semiconductor material wherein the chemical mechanical polishing stops at a top layer of the multilayer stack;
    forming a second device region selected from the group consisting of a source region and a drain region in the second end of the silicon plug, wherein one of the first and second device regions is a source region and the other is a drain region;
    removing a portion of the third layer, thereby exposing the second layer underlying the removed portion of the third layer;
    removing the second layer, thereby exposing a portion of the semiconductor plug;
    forming a layer of dielectric material on the exposed portion of the semiconductor plug;
    forming a gate in contact with the layer of dielectric material.

2. The process of claim 1 wherein the second layer is removed by etching in an etchant, wherein the first layer has a first etch rate, the second layer has a second etch rate, and the third layer has a third etch rate in an etchant, and wherein the second etch rate is at least ten times faster than the first etch rate and the third etch rate in the etchant.

3. The process of claim 1 wherein the semiconductor plug is a doped semiconductor plug and wherein the dopant is selected from the group consisting of n-type dopants and p-type dopants.

4. The process of claim 3 wherein the semiconductor material is a crystalline semiconductor material and is selected from the group consisting of silicon, silicon-germanium, and silicon-germanium-carbon.

5. The process of claim 1 further comprising forming a layer of insulating material over either the first layer of material, the second layer of material, or both the first and second layers of material.

6. The process of claim 5 wherein the layer of insulating material is an etch stop layer.

7. The process of claim 5 wherein the layer of insulating material is an offset spacer.

8. The process of claim 1 wherein the top layer of material in the multilayer stack is a stop for chemical mechanical polishing.

9. The process of claim 8 wherein the top layer of material in the multilayer stack is a silicon nitride layer.

10. The process of claim 1 further comprising forming a diffusion barrier layer over the first device region before the at least three layers of material are formed thereover.

11. The process of claim 1 further comprising forming a layer of thermal oxide on the exposed portion of the semiconductor plug, removing the layer of thermal oxide, and then forming the layer of dielectric material on the exposed portion of the semiconductor plug.

12. The process of claim 11 further comprising controlling the formation of the thermal oxide to provide a desired recess in the semiconductor plug upon removing the layer of thermal oxide.

13. The process of claim 1 wherein the substrate is selected from the group consisting of silicon substrates and silicon on insulator substrates.

14. The process of claim 1 wherein the layer of dielectric material is formed on the semiconductor plug by heating the substrate to a temperature in the range of about 700° C. to about 1100° C. in an oxygen-containing atmosphere.

15. The process of claim 1 wherein the layer of dielectric material is formed on the semiconductor plug by chemical vapor deposition.

16. The process of claim 1 wherein the layer of dielectric material is formed on the semiconductor plug by atomic layer deposition.

17. The process of claim 1 wherein the layer of dielectric material is formed on the semiconductor plug by jet vapor deposition.

18. The process of claim 1 wherein the layer of dielectric material formed on the semiconductor plug is selected from the group consisting of silicon dioxide, silicon nitride, silicon oxynitride and metal oxides.

19. The process of claim 18 wherein the thickness of the layer of dielectric material formed on the semiconductor plug is about 1 nm to about 20 nm.

20. The process of claim 1 wherein the gate is at least one layer of material selected from the group consisting of polycrystalline silicon, doped, amorphous silicon, silicon-germanium, silicon-germanium-carbon, metals, and metal compounds.

21. The process of claim 20 wherein the gate material is formed on the substrate by chemical vapor deposition, electroplating, or a combination thereof.

22. The process of claim 21 wherein the metals and metal compounds are selected from the group consisting of titanium, titanium nitride, tungsten, tungsten silicide, tantalum, tantalum nitride, molybdenum, aluminum and copper.

23. The process of claim 20 wherein the gate is a multilayer structure and the layers are the same or different material.

* * * * *